United States Patent
Lee et al.

(10) Patent No.: US 8,269,211 B2
(45) Date of Patent: Sep. 18, 2012

(54) ORGANIC ELECTRONIC DEVICE WITH AN ORGANIC SEMICONDUCTOR LAYER

(75) Inventors: Sin-Doo Lee, Seoul (KR); Jin-Hyuk Bae, Daegu (KR)

(73) Assignee: Samsung Display Co., Ltd., Yongin (KR)

( * ) Notice: Subject to any disclaimer, the term of this patent is extended or adjusted under 35 U.S.C. 154(b) by 965 days.

(21) Appl. No.: 11/961,935

(22) Filed: Dec. 20, 2007

(65) Prior Publication Data

US 2008/0157068 A1     Jul. 3, 2008

(30) Foreign Application Priority Data

Dec. 29, 2006     (KR) .................. 10-2006-0138900

(51) Int. Cl.
*H01L 51/05* (2006.01)
*H01L 51/40* (2006.01)

(52) U.S. Cl. ........ 257/40; 257/49; 257/57; 257/E51.006

(58) Field of Classification Search .............. 257/40, 257/49, 57, E51.006
See application file for complete search history.

(56) References Cited

U.S. PATENT DOCUMENTS

| | | | |
|---|---|---|---|
| 2002/0121860 A1* | 9/2002 | Seo et al. | 313/506 |
| 2005/0037234 A1* | 2/2005 | Kim et al. | 428/690 |
| 2005/0242342 A1 | 11/2005 | Suh et al. | |
| 2006/0027860 A1 | 2/2006 | Nomoto | |
| 2006/0108581 A1* | 5/2006 | Ahn et al. | 257/40 |
| 2008/0157063 A1* | 7/2008 | Sydorenko et al. | 257/40 |

FOREIGN PATENT DOCUMENTS

| | | |
|---|---|---|
| JP | 2006-49577 A | 2/2006 |
| KR | 10-2005-0104513 A | 11/2005 |
| KR | 10-2005-0104811 A | 11/2005 |
| KR | 10-2005-0112581 A | 12/2005 |

OTHER PUBLICATIONS

KIPO Registration Determination Certificate dated Nov. 26, 2007 for KR 10-2006-0138900 (4 pages).

* cited by examiner

*Primary Examiner* — Ori Nadav
*Assistant Examiner* — Vernon P Webb
(74) *Attorney, Agent, or Firm* — Christie, Parker & Hale, LLP

(57) ABSTRACT

An organic electronic device including: a first layer including a conductive or semiconductive organic material; a second layer including a conductive or semiconductive inorganic material, and in contact with the first layer; and an interface layer between the first layer and the second layer, wherein the interface layer includes a conductive or semiconductive organic material and a conductive or semiconductive inorganic material.

11 Claims, 6 Drawing Sheets

ORGANIC ELECTRONIC DEVICE WITH AN ORGANIC SEMICONDUCTOR LAYER

CROSS-REFERENCE TO RELATED PATENT APPLICATION

This application claims priority to and the benefit of Korean Patent Application No. 10-2006-0138900, filed on Dec. 29, 2006, in the Korean Intellectual Property Office, the entire content of which is incorporated herein by reference.

BACKGROUND OF THE INVENTION

1. Field of the Invention

The present invention relates to an organic electronic device and a method of manufacturing the same, and more particularly, to an organic electronic device having improved contact resistance characteristic and current mobility in an interface between an organic material and an inorganic material and a method of manufacturing the same.

2. Description of the Related Art

Organic electronic devices are electronic devices that use semiconductive organic materials and can be flexibly manufactured in a cost-effective and convenient manner as compared to silicon-based electronic devices.

Since the organic electronic devices use metal electrodes, an interface between an organic material layer and the metal electrode may be electrically incompatible.

Thus, research on the interface between the organic material layer and the metal electrode, in addition to research on the organic material layer, should be necessary to manufacture a next generation electronic device, particularly, a flexible electronic device.

Contact resistance is a representative electrical characteristic occurring in the interface between the organic material layer and the metal layer. In general, the interface between the organic material layer and the metal layer has high contact resistance. The high contact resistance may not be a problem in a single device, but may cause a serious problem in a circuit device prepared by aligning multiple single devices. Since the total resistance increases in the circuit device, the driving voltage may increase, the device performance may decrease, and the circuit may be seriously damaged due to heat generated by the increased resistance. Research on the interface between the organic material layer and the metal layer has been conducted in organic electronic device fields, such as organic thin film transistors, and organic light emitting device fields. However, there is still a need for research on improving electrical characteristics, including contact resistance that is generated in the interface.

A novel material has been introduced between the organic material layer and the metal layer to improve the electrical characteristics, including the contact resistance. However, the fabrication process of organic electronic devices may become complicated due to the introduction of the novel material, and the range of materials that can be used as the novel material to improve the electrical characteristics is limited.

SUMMARY OF THE INVENTION

An aspect of the present invention is directed toward an organic electronic device having improved electrical characteristics, such as contact resistance and current mobility, in an interface between an organic material layer and an inorganic material layer (e.g., particularly, a metal layer).

An embodiment of the present invention provides an organic electronic device including: a first layer including a conductive or semiconductive organic material; a second layer including a conductive or semiconductive inorganic material, and in contact with the first layer; and an interface layer between the first layer and the second layer, wherein the interface layer includes a conductive or semiconductive organic material and a conductive or semiconductive inorganic material.

The organic material of the interface layer may be substantially identical to the organic material of the first layer, and the inorganic material of the interface layer may be substantially identical to the inorganic material of the second layer.

The organic material and inorganic material of the interface layer may have a concentration gradient from the first layer to the second layer.

The concentration of the organic material of the interface layer may be higher at the first layer than at the second layer, and the concentration of the inorganic material of the interface layer may be higher at the second layer than at the first layer.

The interface layer may include layers of the organic material and the inorganic material.

The inorganic material of the interface layer may be a metal or a compound of the metal.

The inorganic material of the interface layer may include a material selected from the group consisting of Ag, Mg, Al, Pt, Pd, Au, Ni, Nd, Ir, Cr, Li, Ca, and compounds thereof.

The inorganic material of the interface layer may include a material selected from the group consisting of indium tin oxide (ITO), indium zinc oxide (IZO), ZnO, and $In_2O_3$.

The organic electronic device may further include a gate electrode electrically insulated from the first layer, wherein the organic material of the first layer may be a semiconductive organic material, and the second layer may include at least one of a source electrode or a drain electrode insulated from the gate electrode.

The semiconductive organic material may include a material compound selected from the group consisting of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, oligoacen of naphthalene and its derivatives, alpha-5-thiophene oligothiophene and its derivatives, phthalocianin that does or does not include a metal and its derivatives, naphthalene tetracarboxylic diimide and its derivatives, naphthalene tetracarboxylic dianhydride and its derivatives, phyromeliticdianhydride and its derivatives, phyromelitic diimid and its derivatives, a conjugate polymer that includes thiopene and its derivatives, and a polymer that comprises fluorene and its derivatives.

The organic electronic device wherein the first layer may include a light emitting layer.

The first layer may include a material selected from the group consisting of copper phthalocyanine (CuPc), N,N'-Di (naphthalene-1-yl)-N,N'-diphenyl-benzidine (NPB), tris-8-hydroxyquinoline aluminum (Alq3), and combinations thereof.

Another embodiment of the present invention provides a method of manufacturing an organic electronic device, the method including: forming a first layer including a conductive or semiconductive organic material or a conductive or semiconductive inorganic material on a base; forming a second layer including a conductive or semiconductive organic material or a conductive or semiconductive inorganic material on the first layer; and forming an interface layer including a conductive or semiconductive interface organic material and a conductive or semiconductive interface inorganic material between the first layer and the second layer, wherein, when the first layer includes the inorganic material, the second material includes the organic material, and, when the first layer includes the organic material, the second layer includes the inorganic material.

The forming the interface layer may include forming the interface layer by concurrently disposing the interface organic material and the interface inorganic material concurrently to form the interface layer.

The forming the interface layer may include forming the interface layer by sequentially disposing the interface organic material and the interface inorganic material.

The forming the interface layer may be performed such that the interface organic material and the interface inorganic material have a concentration gradient from the first layer to the second layer.

When the first layer comprises the organic material and the second layer comprises the inorganic material, the concentration of the interface organic material may be higher at the first layer than at the second layer, and the concentration of the interface inorganic material may be higher at the second layer than at the first layer.

When the second layer comprises the organic material and the first layer comprises the inorganic material, the concentration of the interface organic material may be higher at the second layer than at the first layer, and the concentration of the interface inorganic material may be higher at the first layer than at the second layer.

The forming the interface layer may be performed by a depositing method, a spin coating method, and/or a sol-gel method.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF THE INVENTION

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Figure 1:
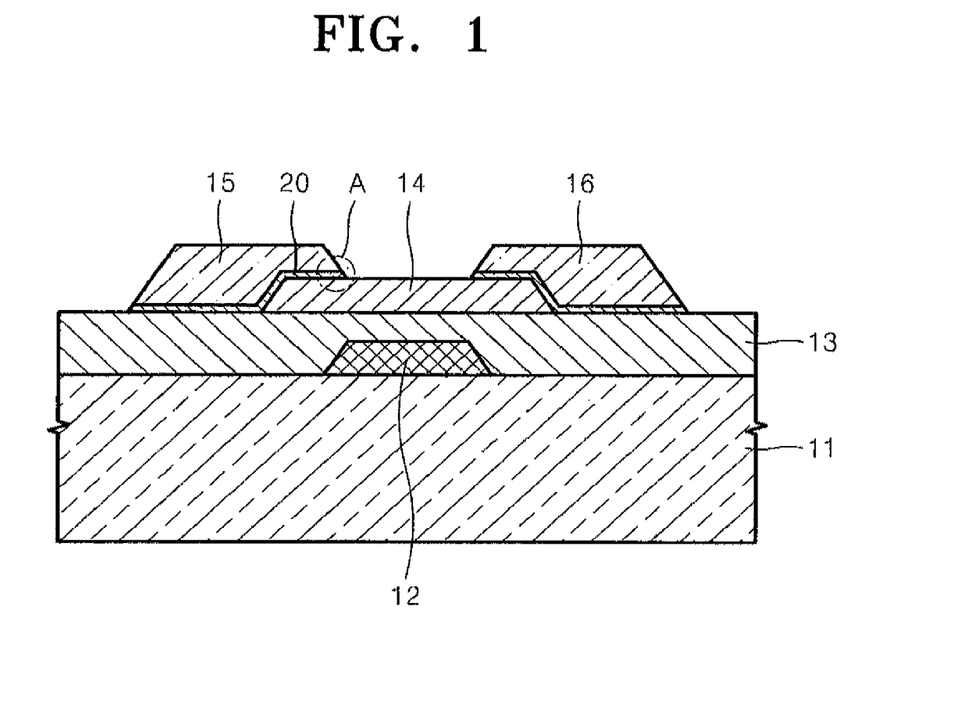
FIG. 1 is a cross-sectional view of an organic thin film transistor according to an embodiment of the present invention.

FIG. 1 is a cross-sectional view of an organic thin film transistor according to an embodiment of the present invention.

Referring to FIG. 1, the organic thin film transistor is formed on a substrate 11.

The substrate 11 can be formed of a plastic material such as acryl, polyimide, polycarbonate, polyester, mylar, etc., but is not limited thereto. That is, the substrate 11 can be formed of a metal foil, such as SUS, tungsten, etc., and glass. The substrate 11 may be flexible to improve the characteristics of the organic electronic device.

An insulating layer, such as a barrier layer and/or a buffer layer, can be formed on an upper surface of the substrate 11 to reduce (or prevent) the diffusion of impurity ions, to reduce (or prevent) the penetration of moisture or external air, and to planarize the surface of the substrate 11.

A gate electrode 12, having a pattern (that may be predetermined) is formed on the substrate 11. The gate electrode 12 can be formed of a metal, such as Au, Ag, Cu, Ni, Pt, Pd, Al, Nd, W and Mo, or an alloy of these metals, such as an Al:Nd alloy and a Mo:W alloy in single or multi-layers. The gate electrode 12 can also be formed of a polymer paste, in which a metal powder is mixed, or a conductive polymer. Further, a metal oxide, such as ITO, IZO, ZnO and $In_2O_3$, may be used.

A gate insulating layer 13, covering the gate electrode 12, is formed on the gate electrode 12. The gate insulating layer 13 can be formed in a single or multilayer structure, and is formed of an organic material, an inorganic material, and an organic/inorganic composite material.

Organic insulating film can be formed of a polymer, for example, an ordinary polymer, such as poly methylmethacrylate (PMMA) or polystyrene (PS), a polymer derivative having a phenol group, an acryl polymer, an imide polymer, an arylether polymer, an amide polymer, a fluorine polymer, a p-gilyrene polymer, a vinylalcohol polymer, or a blend of theses materials.

Inorganic insulating film can be formed of $SiO_2$, SiNx, SiON, $Al_2O_3$, $TiO_2$, $Ta_2O_5$, $HfO_2$, $ZrO_2$, BST, and/or PZT.

When the organic thin film transistor is used for a flexible electronic device, the gate insulating layer 13 may include an organic material.

An organic semiconductive layer 14, which is a first semiconductive layer, is formed of a semiconductive organic material on the gate insulating layer 13.

A source electrode 15 and a drain electrode 16, which are second layers, are formed of an electrically conductive inorganic material on the organic semiconductive layer 14. Interface layers 20 are formed between the organic semiconductive layer 14 and the source electrode 15, and between the organic semiconductive layer 14 and the drain electrode 16, respectively.

The interface layers 20 are formed between the organic semiconductive layer 14, formed of an organic material, and the source and drain electrodes 15,16, formed of an inorganic material, to improve the electrical characteristics of the organic electronic device, and particularly, to form an ohmic contact by reducing the contact resistance.

For this, the interface layer 20 may include an organic material for forming the organic semiconductive layer 14 and an inorganic material for forming the source electrode 15 and drain electrode 16. The interface layer 20 may be formed by simultaneously or sequentially depositing the organic material for forming the organic semiconductive layer 14 and the inorganic material for forming the source electrode 15 and drain electrode 16.

Figure 2:
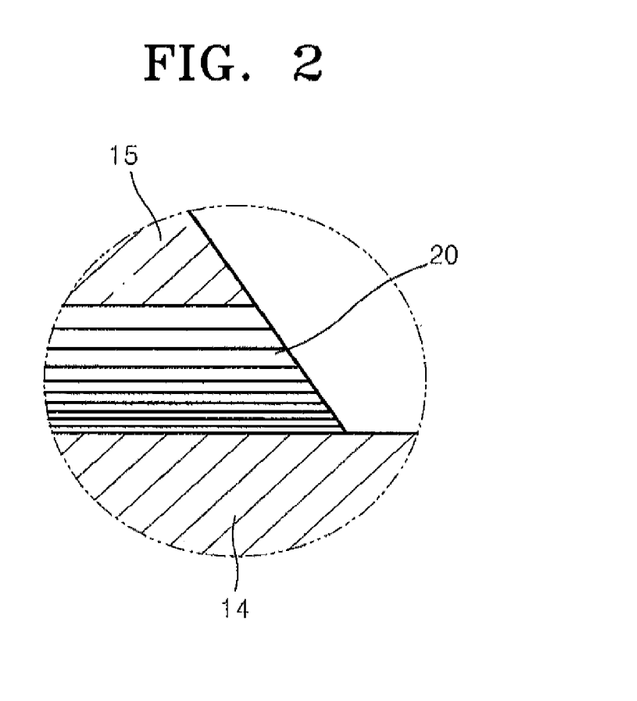
FIG. 2 is a magnified cross-sectional view of an example of region A in FIG. 1.

The organic material and the inorganic material for forming the interface layer 20 may be uniformly mixed through the interface layer 20 in a ratio (that may be predetermined), or the organic material and the inorganic material may have a concentration gradient along the thickness of the interface layer 20 (or from the organic semiconductor layer 14 to the source and drain electrodes 15, 16), as illustrated in FIG. 2. That is, the concentration (or content) of the organic material in the interface layer 20 increases as the organic material is disposed closer to the organic semiconductive layer 14, and the concentration (or content) of the inorganic material in the interface layer increases as the inorganic material is disposed closer to the source electrode 15 and drain electrode 16. Accordingly, more stable electrical characteristics can be obtained in a contact between the organic material and the inorganic material.

Figure 3:
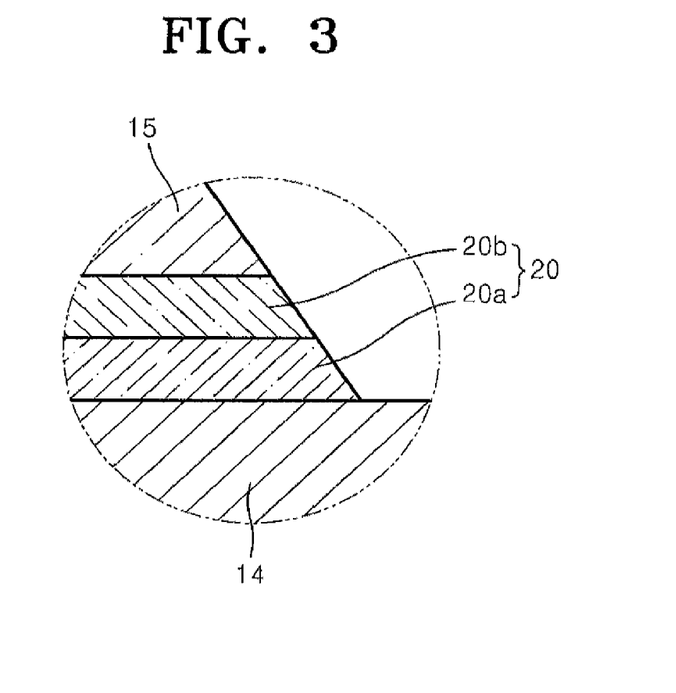
FIG. 3 is a magnified cross-sectional view of another example of region A in FIG. 1.

The organic material and the inorganic material forming the interface layer 20 may be stacked, as illustrated in FIG. 3. Referring to FIG. 3, the organic material layer 20*a* is disposed closer to the organic semiconductive layer 14, and the inorganic material layer 20*b* is disposed closer to the source electrode 15.

The interface layer 20 may have various structures by co-depositing the organic and inorganic materials using vacuum deposition, thermal deposition, chemical vapor deposition, or the like. The interface layer 20 is formed by using a deposition boat containing the organic material and a deposition boat containing the inorganic material in a chamber, and sequentially or simultaneously or concurrently operating the deposition boats. The interface layer 20 having a concentration gradient, illustrated in FIG. 2, may be formed by controlling the deposition speed of the deposition boats containing the organic material and inorganic material. That is, the concentration gradient may be obtained by maintaining the deposition speed of the deposition boat containing the organic material high and the deposition speed of the deposition boat containing the inorganic material low during the initial deposition stage, and then, gradually decreasing the deposition speed of the deposition boat containing the organic material and gradually increasing the deposition speed of the deposition boat containing the inorganic material.

In addition, the interface layer 20 may be formed by using various suitable methods besides the deposition method. A paste including the organic and inorganic materials may be coated using a spin coating or a sol-gel method. A structure having a gradual concentration gradient, as illustrated in FIG. 2, may be formed by controlling the number of coating operations and the ratio between the organic and inorganic materials during the coating operations, and the structure may suitably vary according to the manufacturing conditions.

The organic and inorganic materials forming the interface layer 20 may be, respectively, the organic material forming the organic semiconductive layer 14 and the inorganic material forming the source electrode 15 and drain electrode 16, but is not limited thereto. That is, the interface layer 20 may be formed of a mixture of an conductive or semiconductive organic material and a conductive or semiconductive inorganic material. In one embodiment of the present invention, the organic and inorganic materials for forming the interface layer 20 are, respectively, the organic material forming the organic semiconductive layer 14 and the inorganic material forming the source electrode 15 and drain electrode 16.

As illustrated in FIG. 1, the pattern of the interface layer 20 is the same (or substantially the same) as that of the source electrode 15 and drain electrode 16, since the interface layer 20 is formed when the source electrode 15 and drain electrode 16 are formed.

Figure 4:
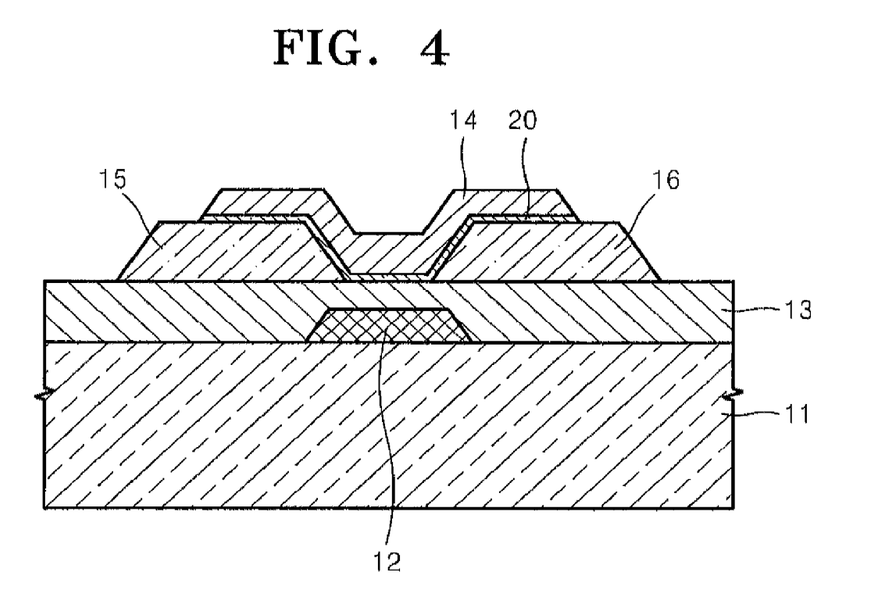
FIG. 4 is a cross-sectional view of an organic thin film transistor according to another embodiment of the present invention.

As illustrated in FIG. 4, the organic semiconductive layer 14 may be formed after the source electrode 15 and drain electrode 16 are formed. Thus, the pattern of the interface layer 20 is the same (or substantially the same) as that of the organic semiconductive layer 14, since the interface layer 20 is formed when the organic semiconductive layer 14 is formed. The description of the organic thin film transistor, as illustrated in FIG. 4, will not be repeated since it is similar to (or substantially the same as) the description for FIG. 1.

In view of the foregoing, a bottom gate type organic thin film transistor, in which a gate electrode is located on a lower portion, has been described, but the structure is not limited thereto. The organic thin film transistor, according to the present invention, can also be applied to a top gate type organic thin film transistor in which a gate electrode is located on an organic semiconductive layer.

Figure 5:
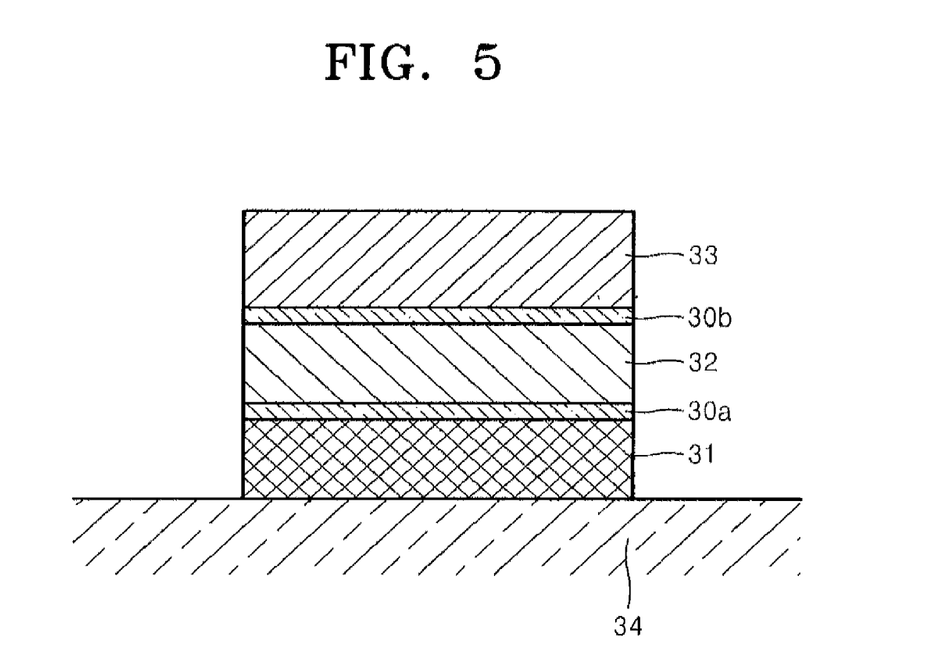
FIG. 5 is a cross-sectional view of an organic light emitting device according to another embodiment of the present invention.

FIG. 5 is a cross-sectional view of an organic light emitting device according to another embodiment of the present invention.

The organic light emitting device of FIG. 5 includes a first electrode 31 and a second electrode 33 which face each other, and an organic light emitting layer 32 interposed between the first electrode 31 and the second electrode 33.

The first electrode 31 and the second electrode 33 are insulated from each other by the organic light emitting layer 32, and apply voltages of opposite polarities to the organic light emitting layer 32, so that the organic light emitting layer 32 emits lights.

When images are displayed toward a base substrate 34, the first electrode 31 may be a transparent electrode, and light emitted by the light emitting layer 32 proceeds toward the base substrate 34 while passing through the first electrode 31. When the first electrode 31 operates as an anode, the first electrode 31 can be formed of a transparent material having a high work function, such as ITO, IZO, ZnO, or $In_2O_3$. When the first electrode 31 operates as a cathode, the first electrode 31 can be formed as a semi-translucent thin film of a metal having a low work function, such as Ag, Mg, Al, Pt, Pd, Au, Ni, Nd, Ir, Cr, Li, Ca, and compounds thereof, and to increase the conductivity of the first electrode 31, a transparent material may be disposed between the semi-translucent thin film and the base substrate 34. Here, the second electrode 33 may be a reflective electrode. When the second electrode 33 operates as a cathode, the second electrode 33 may be formed of a metal having a low work function, such as Ag, Mg, Al, Pt, Pd, Au, Ni, Nd, Ir, Cr, Li, Ca, and compounds thereof to an appropriate thickness to reflect light. When the second electrode 33 operates as an anode, the second electrode 33 may be formed of a transparent conductive material having a high work function, such as ITO, IZO, ZnO, or $In_2O_3$, and a reflective layer may be formed on the transparent conductive material.

When light proceeds toward the second electrode 33, the structure of the first electrode 31 and the second electrode 33 may be switched with respect to the arrangement described above.

The organic light emitting layer 32 may be made of a low molecular weight organic material or a polymer organic material. When the organic light emitting layer 32 is made of a low molecular weight organic material, a hole injection layer (HIL), a hole transport layer (HTL), an emission layer (EML), an electron transport layer (ETL), an electron injection layer (EIL), etc., may be stacked forming a single or multi layer structure. Examples of low molecular weight organic material that can be used include copper phthalocyanine (CuPc), N,N'-Di(naphthalene-1-yl)-N,N'-diphenyl-benzidine (NPB), and tris-8-hydroxyquinoline aluminum (Alq3).

When the organic light emitting layer 32 is made of a polymer organic material, an HTL and an EML may be included in the polymer organic layer. Here, PEDOT may be used as the HTL, and a poly-phenylenevinylene (PPV)-based and polyfluorene-based polymer may be used as the EML.

In the organic light emitting device, the interface layers 30a and 30b may be formed, respectively, between the first electrode 31 and the organic light emitting layer 32, and between the second electrode 33 and the organic light emitting layer 32.

The first interface layer 30a, that is formed between the first electrode 31 and the organic light emitting layer 32, may be formed in consideration of the electrical characteristics of the first electrode 31 and the organic light emitting layer 32, and the second interface layer 30b, that is formed between the second electrode 33 and the organic light emitting layer 32, may be formed in consideration of the electrical characteristics of the second electrode 33 and the organic light emitting layer 32.

Accordingly, in one embodiment, the inorganic material forming the first electrode 31 is mixed with the organic material forming the organic light emitting layer 32 to form the first interface layer 30a, having a gradual concentration gradient structure, as illustrated in FIG. 2, or an interlayer structure, as illustrated in FIG. 3.

In the same (or substantially the same) manner, the inorganic material for forming the second electrode 33 is mixed with the organic material for forming the organic light emitting layer 32 to form the second interface layer 30b, having a gradual concentration gradient structure, as illustrated in FIG. 2, or an interlayer structure, as illustrated in FIG. 3.

In this case, a contact resistance may be reduced between the first electrode 31 and the organic light emitting layer 32, and between the second electrode 33 and the organic light emitting layer 32, thus, brightness and efficiency may be improved due to smooth carrier flow. Various organic and inorganic materials can be used as the organic and inorganic materials forming the interface layer 30a and 30b, illustrated in FIG. 5, in addition to the inorganic material forming the first electrode 31 and the second electrode 33, and the organic material forming the organic light emitting layer 32.

Figure 6:
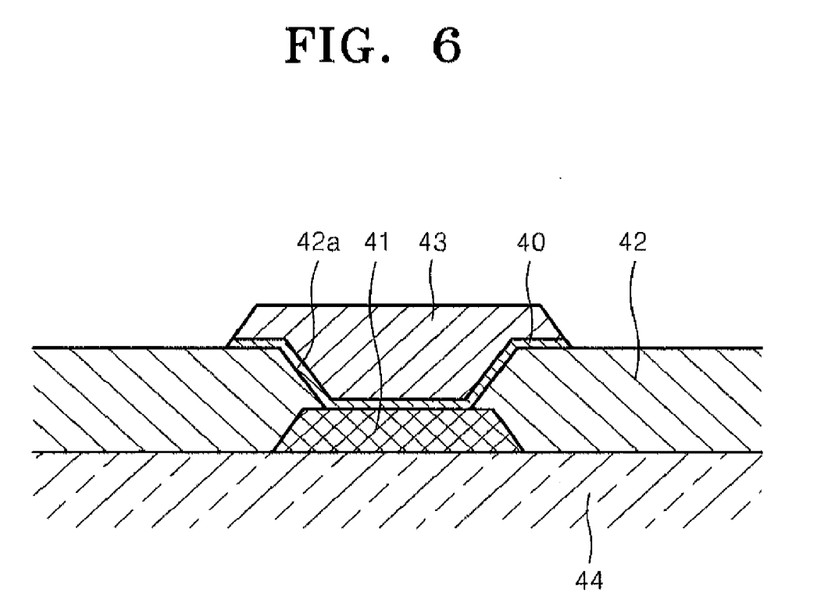
FIG. 6 is a cross-sectional view of a schematic wire contact structure according to another embodiment of the present invention.

FIG. 6 is a cross-sectional view of a schematic wire contact structure according to another embodiment of the present invention.

A first wire 41 is formed on a base substrate 44, an insulating layer 42 covering the wire 41 is formed on the first wire 41, and a second wire 43 is formed on the insulating layer 42. A contact hole 42a is formed in the insulating layer to couple the first wire 41 with the second wire 43.

The first wire 41 may be formed of a conductive organic material, and the second wire 43 may be formed of a conductive inorganic material. Further, the first wire 41 may be formed of a conductive inorganic material, and the second wire 43 may be formed of a conductive organic material.

Here, an interface layer 40, which is formed between the first wire 41 and the second wire 43, can be formed of a mixture of a conductive organic material and a conductive inorganic material.

As described in the previous embodiment, the interface layer 40 may be formed in consideration of the electrical characteristics of the first wire 41 and the second wire 43, and thus a material forming the first wire 41 is mixed with a material forming the second wire 43 to form the interface layer 40 having a gradual concentration gradient structure, as illustrated in FIG. 2, or an interlayer structure, as illustrated in FIG. 3.

In this case, a contact resistance may be reduced between the first wire 41 and the second wire 43.

The following exemplary embodiments illustrate the present invention in more detail. However, the present invention is not limited by these exemplary embodiments.

EMBODIMENTS

A bottom gate type organic thin film transistor, as illustrated in FIG. 1, was prepared.

A glass substrate was used as a substrate 11, ITO was used as a gate electrode 12, pentacene was used as an organic semiconductive layer 14, and Au was used as source/drain electrodes 15 and 16. In the current embodiment, an interface layer 20 was formed between the organic semiconductive layer 14 and the source/drain electrodes 15 and 16, as illustrated in FIG. 1, but the interface layer 20 was not formed in a comparative example.

The interface layer 20 was formed using vacuum deposition, and the thickness of pentacene and Au and deposition speed were controlled during the deposition. The substrate was maintained at room temperature during the deposition.

The organic and inorganic materials were mixed in the interface layer 20, and the thickness of the interface layer 20 was 10 nm, 20 nm, 30 nm, and 50 nm (Embodiments 1 through 4).

Figure 7:
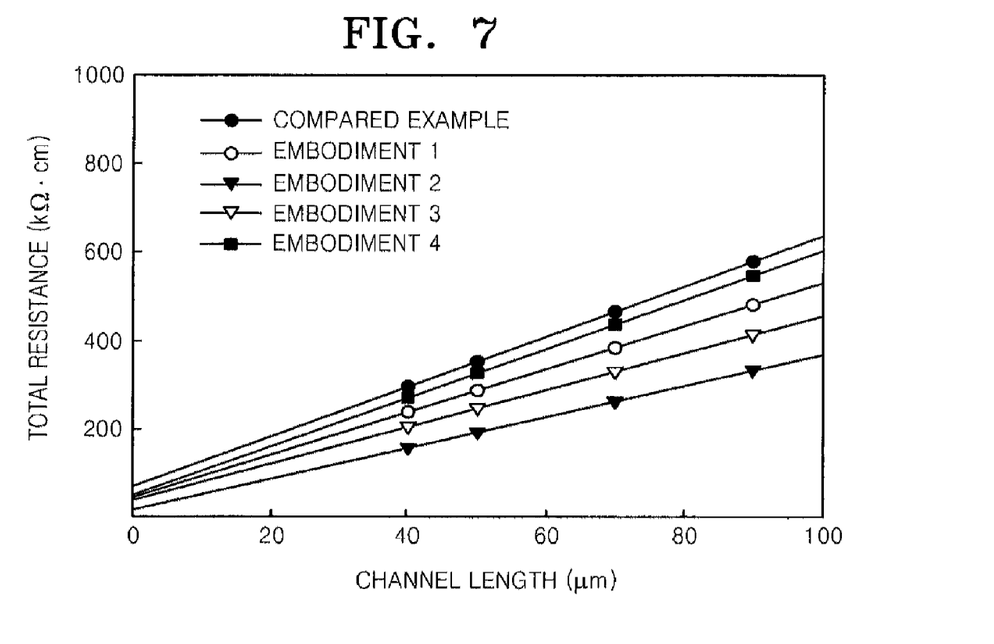
FIG. 7 is a graph illustrating the total resistance per channel length according to embodiments of the present invention and a comparative example.

FIG. 7 is a graph illustrating the total resistance per channel length according to embodiments of the present invention and a comparative example. FIG. 7 is a graph illustrating linear regions in a transistor in which voltages applied from the source/drain electrodes are smaller than those applied from the gate electrode.

The horizontal axis indicates channel length, and the vertical axis indicates the total resistance in the graph of FIG. 7. The slopes in the graph of FIG. 7 indicate channel resistance per unit channel length, and the contact resistances are obtained at points that meet the vertical axis, that is when the channel length is 0 μm.

As illustrated in FIG. 7, the contact resistance of the organic electronic devices, including the interface layer prepared according to embodiments of the present invention, are lower compared to those prepared according to the comparative example.

Figure 8:
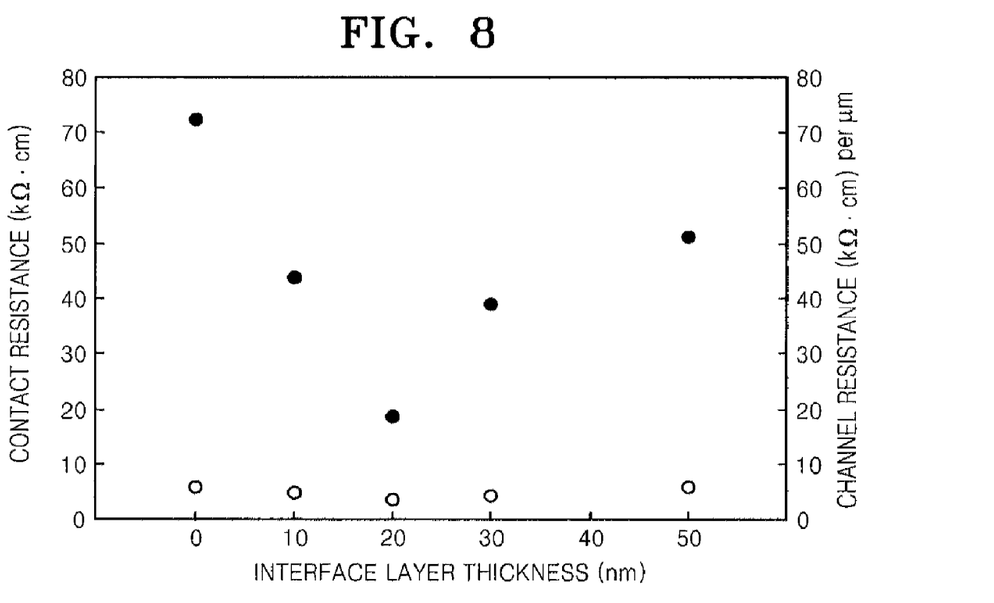
FIG. 8 is a graph illustrating the contact resistance and channel resistance according to embodiments of the present invention and a comparative example.

FIG. 8 is a graph illustrating the contact resistance and channel resistance according to the exemplary embodiments of the present invention (e.g., having the interface layer thicknesses discussed for FIG. 7) and the comparative example (e.g., having an interface layer thickness of 0 nm). The left vertical axis indicates the contact resistance, which is shown using black points, and the right vertical axis indicates the channel resistance, which is shown using white points. Referring to FIG. 8, the organic electronic devices prepared according to the embodiments of the present invention have smaller contact resistances compared to those prepared according to the comparative example. In particular, when the thickness of the interface layer is 20 nm, the organic electronic device has the lowest contact resistance. However, the organic electronic devices have almost constant channel resistance.

Referring to FIG. 8, an organic electronic device, including an interface layer having a thickness of 20 nm prepared according to Embodiment 2 of the present invention, had a contact resistance of about ¼ of the contact resistance of a conventional organic electron device, not including the interface layer, prepared according to the comparative example.

Figure 9A:
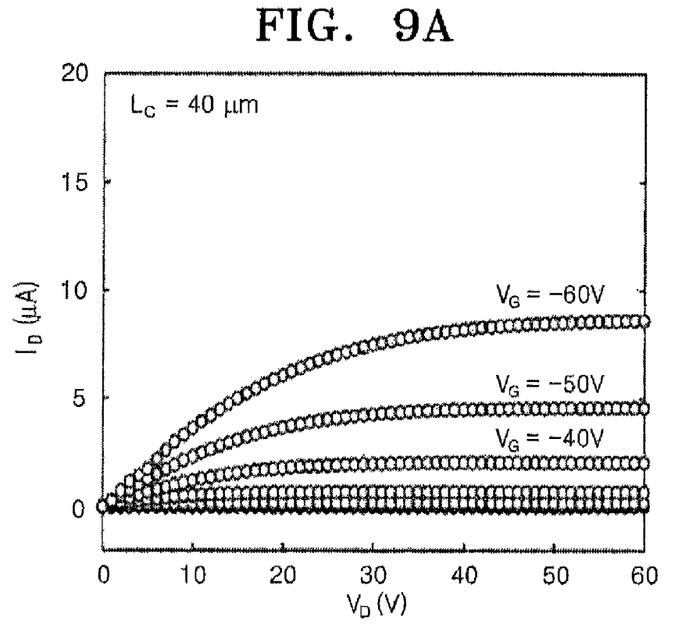
FIGS. 9A and 9B are graphs illustrating current and voltage characteristics in saturated regions of transistors according to a comparative example and Embodiment 2 of the present invention.
Figure 9B:
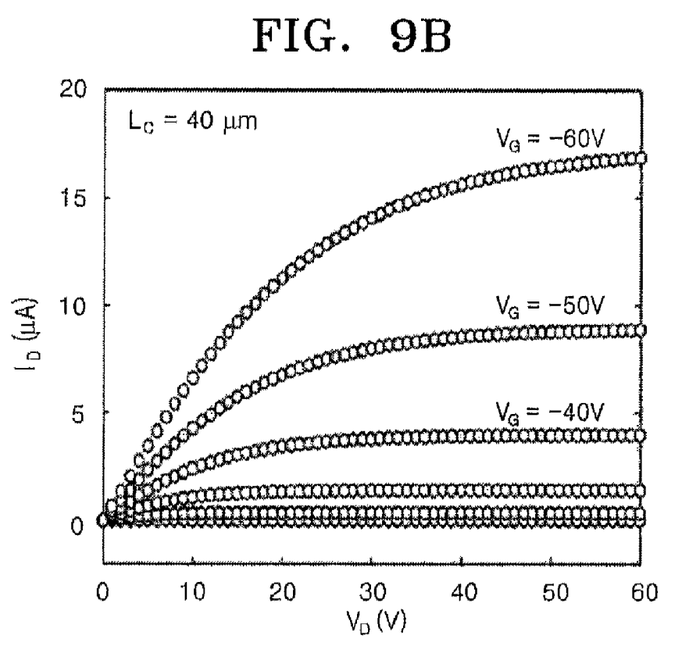

FIGS. 9A and 9B are graphs illustrating current and voltage characteristics in saturated regions of a conventional transistor, not including an interface layer according to the comparative example, and a transistor, including the interface layer according to Embodiment 2 of the present invention. Here, the channel length was 40 μm.

As illustrated in FIGS. 9A and 9Bb, a drain current was increased at the same (or substantially the same) voltage.

Further, the current output of the conventional transistor at a gate voltage of −60 V, as illustrated in FIG. 9A, was similar to the current output of the transistor of Embodiment 2 at a gate voltage of −50 V, as illustrated in FIG. 9B, at a drain voltage of −60 V.

Here, the current output of the transistor of Embodiment 2 increased since the carrier could be more easily injected due to the reduced contact resistance.

Further, current mobility, which is an index representing performance of devices, is measured in a saturated region of an organic thin film transistor prepared according to an embodiment of the present invention at which the gate voltage and the drain voltage were both −60 V.

The current mobility of the conventional transistor, not including an interface layer prepared according to the comparative example, was 0.096 $cm^2$/Vs, and the current mobility of the transistor, including and interface layer prepared according to Embodiment 2 of the present invention, was 0.160 $cm^2$/Vs. Thus, the efficiency of the devices including the interface layer was improved.

Figure 10:
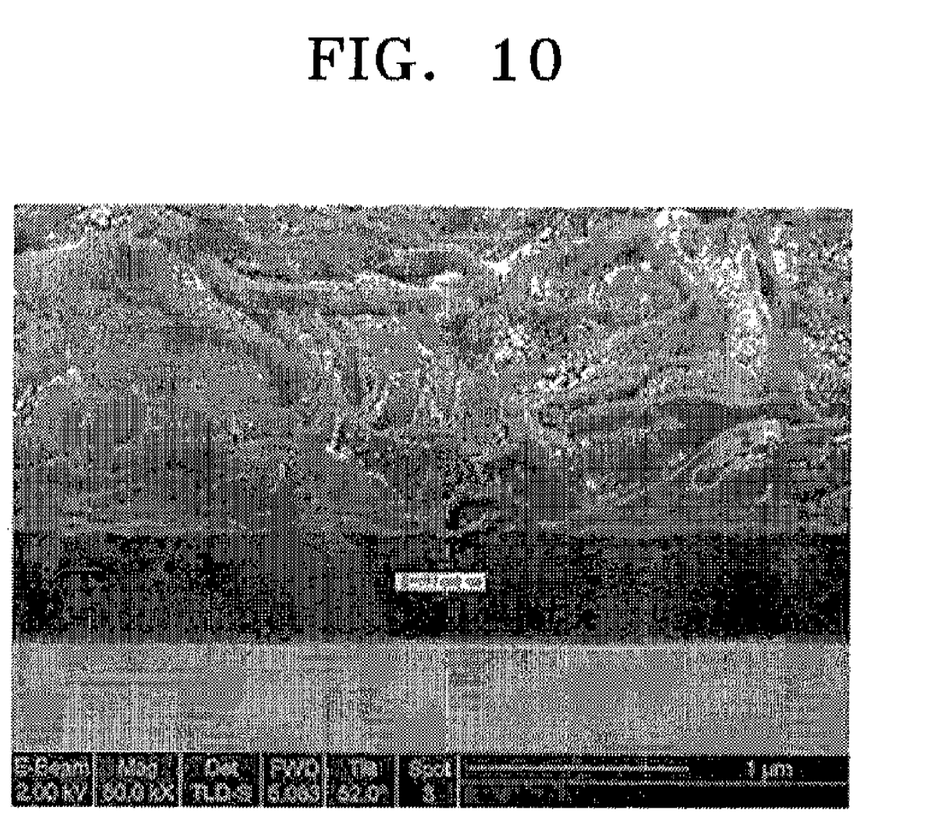
FIG. 10 is a focus ion beam (FIB) photograph of an interface prepared according to Embodiment 2 of the present invention.

FIG. 10 is a focus ion beam (FIB) photograph of an interface layer prepared according to Embodiment 2 of the present invention. Referring to FIG. 10, metal particles are deposited between the organic materials, as can be seen in the FIB photograph.

In view of the foregoing and according to and embodiment of the present invention, electrical characteristics in the interface between an organic material and an inorganic material (e.g., metal) can be improved, and thus the interface layer can be effectively applied to an organic electronic device.

That is, a larger amount of current can flow in the interface layer in the organic thin film transistor of the embodiment of the present invention by reducing the contact resistance between the organic material and electrodes and facilitating electron injection, as compared to conventional devices. Further, heat and power consumption due to the contact resistance, which can be generated when a plurality of devices are aligned, can be reduced. The manufacturing process can be relatively simply performed, since a novel material is not required in the interface layer of the present invention.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic electronic device comprising:
    a first layer comprising a conductive or semiconductive organic material;
    a second layer comprising a conductive or semiconductive inorganic material, and in electrical contact with the first layer; and
    an interface layer between the first layer and the second layer,
    wherein the interface layer comprises a conductive or semiconductive organic material and a conductive or semiconductive inorganic material, and
    wherein the organic material and inorganic material of the interface layer have a concentration gradient from the first layer to the second layer, the concentration of the inorganic material in the interface layer being higher at the second layer than at the first layer.

2. The organic electronic device of claim 1, wherein the organic material of the interface layer is substantially identical to the organic material of the first layer, and the inorganic material of the interface layer is substantially identical to the inorganic material of the second layer.

3. The organic electronic device of claim 1, wherein the concentration of the organic material of the interface layer is higher at the first layer than at the second layer.

4. The organic electronic device of claim 1, wherein the interface layer comprises layers of the organic material and the inorganic material.

5. The organic electronic device of claim 1, wherein the inorganic material of the interface layer is a metal or a compound of the metal.

6. The organic electronic device of claim 1, wherein the inorganic material of the interface layer comprises a material selected from the group consisting of Ag, Mg, Al, Pt, Pd, Au, Ni, Nd, Ir, Cr, Li, Ca, and compounds thereof.

7. The organic electronic device of claim 1, wherein the inorganic material of the interface layer comprises a material selected from the group consisting of indium tin oxide (ITO), indium zinc oxide (IZO), ZnO, and $In_2O_3$.

8. The organic electronic device of claim 1 further comprising a gate electrode electrically insulated from the first layer, wherein the organic material of the first layer is a semiconductive organic material, and the second layer comprises at least one of a source electrode or a drain electrode that is insulated from the gate electrode.

9. The organic electronic device of claim 8, wherein the semiconductive organic material comprises a material compound selected from the group consisting of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, oligoacen of naphthalene and its derivatives, alpha-5-thiophene oligothiophene and its derivatives, phthalocianin that does or does not include a metal and its derivatives, naphthalene tetracarboxylic diimide and its derivatives, naphthalene tetracarboxylic dianhydride and its derivatives, phyromeliticdianhydride and its derivatives, phyromelitic diimid and its derivatives, a conjugate polymer that includes thiopene and its derivatives, and a polymer that comprises fluorene and its derivatives.

10. The organic electronic device of claim 1, wherein the first layer comprises a light emitting layer.

11. The organic electronic device of claim 1, wherein the first layer comprises a material selected from the group consisting of copper phthalocyanine (CuPc), N,N'-Di(naphthalene-1-yl)-N,N'-diphenyl-benzidine (NPB), tris-8-hydroxyquinoline aluminum (Alq3), and combinations thereof.

* * * * *

UNITED STATES PATENT AND TRADEMARK OFFICE
CERTIFICATE OF CORRECTION

| | | |
|---|---|---|
| PATENT NO. | : 8,269,211 B2 | Page 1 of 1 |
| APPLICATION NO. | : 11/961935 | |
| DATED | : September 18, 2012 | |
| INVENTOR(S) | : Lee et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1015 days.

Signed and Sealed this
Fifteenth Day of July, 2014

Michelle K. Lee
*Deputy Director of the United States Patent and Trademark Office*